(12) United States Patent
Akahane

(10) Patent No.: US 9,312,845 B2
(45) Date of Patent: Apr. 12, 2016

(54) SEMICONDUCTOR DEVICE

(71) Applicant: FUJI ELECTRIC CO., LTD., Kawasaki-shi (JP)

(72) Inventor: Masashi Akahane, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 62 days.

(21) Appl. No.: 14/328,055

(22) Filed: Jul. 10, 2014

(65) Prior Publication Data

US 2014/0320180 A1    Oct. 30, 2014

Related U.S. Application Data

(63) Continuation of application No. PCT/JP2013/051109, filed on Jan. 21, 2013.

(30) Foreign Application Priority Data

Apr. 2, 2012   (JP) ................................. 2012-084069

(51) Int. Cl.
*H03B 1/00*     (2006.01)
*H03K 3/00*     (2006.01)
(Continued)

(52) U.S. Cl.
CPC ............ *H03K 17/0822* (2013.01); *H03K 3/012* (2013.01); *H03K 7/08* (2013.01);
(Continued)

(58) Field of Classification Search
CPC .... H03K 19/173; H03K 17/0822; G06K 7/38
USPC ........................ 327/108, 201, 333; 326/80–81
See application file for complete search history.

(56) References Cited

U.S. PATENT DOCUMENTS 5,917,359 A *   6/1999   Fukunaga et al. ............ 327/381
2003/0016054 A1   1/2003   Okamoto et al.
(Continued)

FOREIGN PATENT DOCUMENTS

EP    1860763 A2    11/2007
GB    2244400 A     11/1991
(Continued)

OTHER PUBLICATIONS

International Search Report for PCT/JP2013/051109, mail date Feb. 12, 2013.
(Continued)

*Primary Examiner* — Sibin Chen
*Assistant Examiner* — Metasebia Retebo
(74) *Attorney, Agent, or Firm* — Rossi, Kimms & McDowell LLP

(57) ABSTRACT

In aspects of the invention, a semiconductor device can include one level shift circuit that outputs a low-side input signal as a high-side signal upon raising a signal level, a pulse modulation circuit that operates in a low-side region, generates a data symbol constituted by or more bits and representing a set signal or a reset signal, where bit is defined as a combination of codes forming a pair. The pulse generation circuit can output the generated data symbol as an input signal of the level shift circuit. Also included can be a pulse demodulation circuit that operates in a high-side region, demodulates the data symbol outputted from the level shift circuit and generates a level-shifted set signal or reset signal; and a control circuit that controls conduction/non-conduction of the high-potential-side switching element on the basis of the level-shifted set signal or reset signal outputted from the pulse demodulation circuit.

4 Claims, 15 Drawing Sheets

(51) Int. Cl.
*H03K 17/082* (2006.01)
*H03K 7/08* (2006.01)
*H03K 9/08* (2006.01)
*H03K 17/16* (2006.01)
*H03K 3/012* (2006.01)
*H03K 17/22* (2006.01)
*H03K 19/0175* (2006.01)

(52) U.S. Cl.
CPC ............... *H03K 9/08* (2013.01); *H03K 17/162* (2013.01); *H03K 17/22* (2013.01); *H03K 19/017509* (2013.01); *H03K 2217/0063* (2013.01)

(56) References Cited

U.S. PATENT DOCUMENTS

| | | |
|---|---|---|
| 2003/0048116 A1 | 3/2003 | Suetsugu |
| 2011/0115542 A1 | 5/2011 | Koike |
| 2011/0134710 A1 | 6/2011 | Akahane |
| 2011/0227626 A1 | 9/2011 | Sakurai et al. |

FOREIGN PATENT DOCUMENTS

| | | |
|---|---|---|
| JP | 07-297693 A | 11/1995 |
| JP | 2003-079131 A | 3/2003 |
| JP | 3773863 B2 | 5/2006 |
| JP | 2006-157367 A | 6/2006 |
| JP | 2011-139423 A | 7/2011 |
| JP | 2011-193419 A | 9/2011 |

OTHER PUBLICATIONS

European Search Report issued in European counterpart application No. EP13772305.2, dated Jun. 25, 2015.

\* cited by examiner

OPERATION TIME CHART OF HIGH-SIDE DRIVE CIRCUIT 1

OPERATION TIME CHART OF CONVENTIONAL
HIGH-SIDE DRIVE CIRCUIT

US 9,312,845 B2

SEMICONDUCTOR DEVICE

CROSS-REFERENCE TO RELATED REFERENCES

This application is a continuation of International Application No. PCT/JP 2013/051109, filed on 21 Jan. 2013, which is based on and claims priority to Japanese Patent Application No. JP 2012-084069, filed on 2 Apr. 2012. The disclosure of the Japanese priority application and the PCT application in their entirety, including the drawings, claims, and the specification thereof, are incorporated herein by reference.

BACKGROUND

1. Field of the Invention

Embodiments of the invention relate to semiconductor devices that can be used in a half-bridge power source and have a level shift circuit.

2. Related Art

The circuit of a half-bridge power source or the like is typically configured as shown in FIG. 15. This circuit is provided with an output circuit 60 in which a high-potential-side switching element XD1 and a low-potential-side switching element XD2 are connected in series. An input buffer and protection circuit 70 that generates a high-side drive signal Hdrv for driving the high-potential-side switching element XD1 and a low-side drive signal Ldrv for driving the low-potential-side switching element XD2 is connected to the output circuit 60. This circuit is also provided with a low-side drive circuit 80 that outputs a drive signal LO for driving the low-potential-side switching element XD2 on the basis of the low-side drive signal Ldrv. This circuit also includes a high-side drive circuit 90 that transmits the high-side drive signal Hdrv, which is a pulse signal of a low-potential system outputted from the input buffer and protection circuit 70, to the high-potential system and drives the high-potential-side switching element XD1.

The present invention relates to a high-side drive circuit and uses the conventional technique for the low-side drive circuit. Therefore, the explanation of the low-side drive circuit is hereinbelow omitted.

The configuration of the high-side drive circuit 90 is explained below with reference to FIG. 16. The high-side drive circuit 90 is provided with a pulse generating circuit 91, two level shift circuits 93, 94, a latch malfunction protection circuit 95, a latch circuit 96, and a high-side driver 97.

The pulse generating circuit 91 outputs two micro-pulse signals synchronized with the rise edge and fall edge of the high-side drive signal Hdrv, which is a pulse signal of a low-potential system outputted from the input buffer and protection circuit 70. The micro-pulse signal synchronized with the rise edge of the high-side drive signal Hdrv is a set signal (SET) for setting ON the high-potential-side switching element XD1. The micro-pulse signal synchronized with the fall edge of the high-side drive signal Hdrv is a reset signal (RESET) for setting OFF the high-potential-side switching element XD1.

The level shift circuit 93 shifts the level of the set signal (SET) outputted from the pulse generating circuit 91 to a high-potential system and outputs a level-shifted set signal (SETDRN), which is the set signal of the high-potential system. The level shift circuit 94 shifts the level of the reset signal (RESET) outputted from the pulse generating circuit 91 to a high-potential system and outputs a level-shifted reset signal (RESDRN), which is the reset signal of the high-potential system.

The latch circuit 96 latches the level-shifted set signal (SETDRN) and the level-shifted reset signal (RESDRN) and outputs the latched signals. The high-side driver 97 outputs a drive signal HO that drives the high-potential side switching element XD1 on the basis of the signals latched by the latch circuit 96. The latch malfunction protection circuit 95 is provided at the front stage of the latch circuit 96 and prevents the latch circuit 96 from malfunctioning.

FIG. 17 is an operation time chart of the conventional high-side drive circuit 90. The set signal (SET) is outputted at the fall of the control input signal Hdrv, and the reset signal (RESET) is outputted at the rise of the Hdrv. The level-shifted set signal (SETDRN) and the level-shifted reset signal (RESDRN), which are the outputs of the level shift circuits 93, 94, are outputted as respective negative logic signals. In a control signal output circuit 92 constituted by the latch malfunction protection circuit 95, latch circuit 96, and high-side driver 97, on the basis of those signals, the drive signal H0 is ON when the SETDRN signal is negative (effective), and the drive signal H0 is OFF when the RESDRN signal is negative (ineffective). When the drive signal H0 is ON, the high-potential-side switching element XD1 is in a conductive state, and when the drive signal H0 is OFF, the high-potential-side switching element XD1 is in a non-conductive state.

Where the switching elements XD1, XD2 are driven and electric power is supplied to an inductive load L1, the electric potential Vs of a contact point P1 of the switching elements can change, thereby generating dV/dt noise.

A technique has been suggested for preventing the malfunction caused by the dV/dt noise, which is the noise generated by abrupt voltage changes (dV/dt) caused by the operation of the switching elements.

For example, Japanese Patent Application Publication No. 2011-139423 (also referred to herein as "Patent Document 1") suggests a technique that can prevent the malfunction caused by dV/dt noise, without generating a through electric current, by the feedback of the output of a latch circuit to a level shift circuit side.

Japanese Patent No. 3773863 (also referred to herein as "Patent Document 2") suggests a technique for preventing the malfunction by applying a continuous pulse (repetitive pulse) to each of two level shift circuits.

However, the techniques described in the aforementioned Patent Document 1 and Patent Document 2 each use two level shift circuits, one on the set side and one on the reset side, an out-of-synch operation caused by a spread in characteristics of device elements on the set side and reset side inside a semiconductor device appears when an abrupt voltage change (dV/dt) occurs due to the operation of switching elements, and this out-of-synch operation causes a malfunction. For example, a spread in parasitic capacitances Cds1, Cds2 can be the aforementioned spread in characteristics of device elements.

SUMMARY OF THE INVENTION

The present invention has been created with the foregoing in view, and it is an objective thereof to provide a semiconductor device in which malfunction caused by the effect of spread in characteristics of the device elements on the set side and reset side or the dV/dt noise can be prevented and cost can be reduced.

In order to attain the abovementioned objective, the present invention provides a semiconductor device that performs, from among a high-potential-side switching element and a low-potential-side switching element, which are connected in series and which are interposed between a high-potential main power supply potential and a low-potential main power supply potential, drive control of the high-potential-side switching element, this semiconductor device including: one level shift circuit that outputs an input signal of a low-side region operating in a low-voltage potential system, as a signal of a high-side region operating in a high-voltage potential system, upon raising a signal level; a pulse modulation circuit that operates in a low-side region, generates a data symbol constituted by 2 or more bits and representing a set signal or a reset signal, where 1 bit is defined as a combination of H, L codes forming a pair, and outputs the generated data symbol as an input signal of the level shift circuit; a pulse demodulation circuit that operates in a high-side region, demodulates the data symbol outputted from the level shift circuit, and generates a level-shifted set signal or reset signal; and a control circuit that controls conduction/non-conduction of the high-potential-side switching element on the basis of the level-shifted set signal or reset signal outputted from the pulse demodulation circuit.

In the present invention, the set signal and reset signal serving for operating the high-potential-side switching element are converted into data symbols and transmitted to the high-potential system by a single level shift circuit, without being transmitted to the high-potential system through respective level shift circuits. Therefore, malfunction caused by a spread in characteristics between the semiconductor devices can be prevented. Further, by taking 1 bit as a combination of H, L codes forming a pair, it is possible to reduce the inter-code interference, and the signal component band is broadened by comparison with that of NRZ code in which 1 bit is represented by either an H level or an L level. Therefore, the semiconductor device can operate at a high speed.

The pulse modulation circuit of the semiconductor device in accordance with the present invention has: a state machine in which an internal state makes a successive transition in response to a clock input; a first timer circuit that determines a fall timing of the data symbol; and a second timer circuit that detects a rise of a control input signal and determines a state transition timing of the state machine, and the state machine makes a successive transition at least to a first state and a second state as determined by the second timer circuit, sends a start bit when in the first state, and sends a data bit representing a set signal or a reset signal when in the second state.

In accordance with the present invention, the control input signal is converted into a data symbol by using the state machine in a low-side region, and this data symbol is demodulated by using the state machine in a high-side region. Therefore, a malfunction caused by a data error generated under the effect of dV/dt noise or the like can be inhibited.

The semiconductor device in accordance with the present invention can also include a level shift circuit group which is provided with a level shift circuit that outputs an input signal of a high-side region as a signal of a low-side region upon lowering a signal level, and which can implement bidirectional signal transmission. As a result, error monitoring can be performed, for example, by returning the signal transmitted from the low-side region to the high-side region back to the low-side region and performing a matching check.

As explained hereinabove, in the semiconductor device in accordance with the present invention, a set signal and a reset signal for controlling a high-potential-side switching element are transmitted by modulation and demodulation with a single level shift circuit. Therefore, the effect of dV/dt noise or the like can be reduced and a malfunction caused by a spread in characteristics of devices, which occurs when the system is constituted by two level shift circuits, can be prevented. Further, in the conventional configuration, two level shift circuits have been used for driving the high-potential-side switching element, but in the semiconductor device in accordance with the present invention, the high-potential-side switching element can be driven by a single level shift circuit. Therefore, the cost can be reduced.

DETAILED DESCRIPTION

A semiconductor device according to an example of the present invention will be explained below with reference to the appended drawings. Examples described hereinbelow are the preferred specific examples of the semiconductor device in accordance with the present invention, and although those examples may have various technically preferred limitations, the technical scope of the present invention is not limited to those examples, unless specifically indicated otherwise. The constituent elements in the embodiment described hereinbelow can be replaced, as appropriate, by the presently available constituent elements, and a variety of combinations with other already available constituent elements can be also used. Therefore, the contents of the invention set forth in the claims are not limited to the description of the embodiment.

(Configuration of Semiconductor Device)

Figure 1:
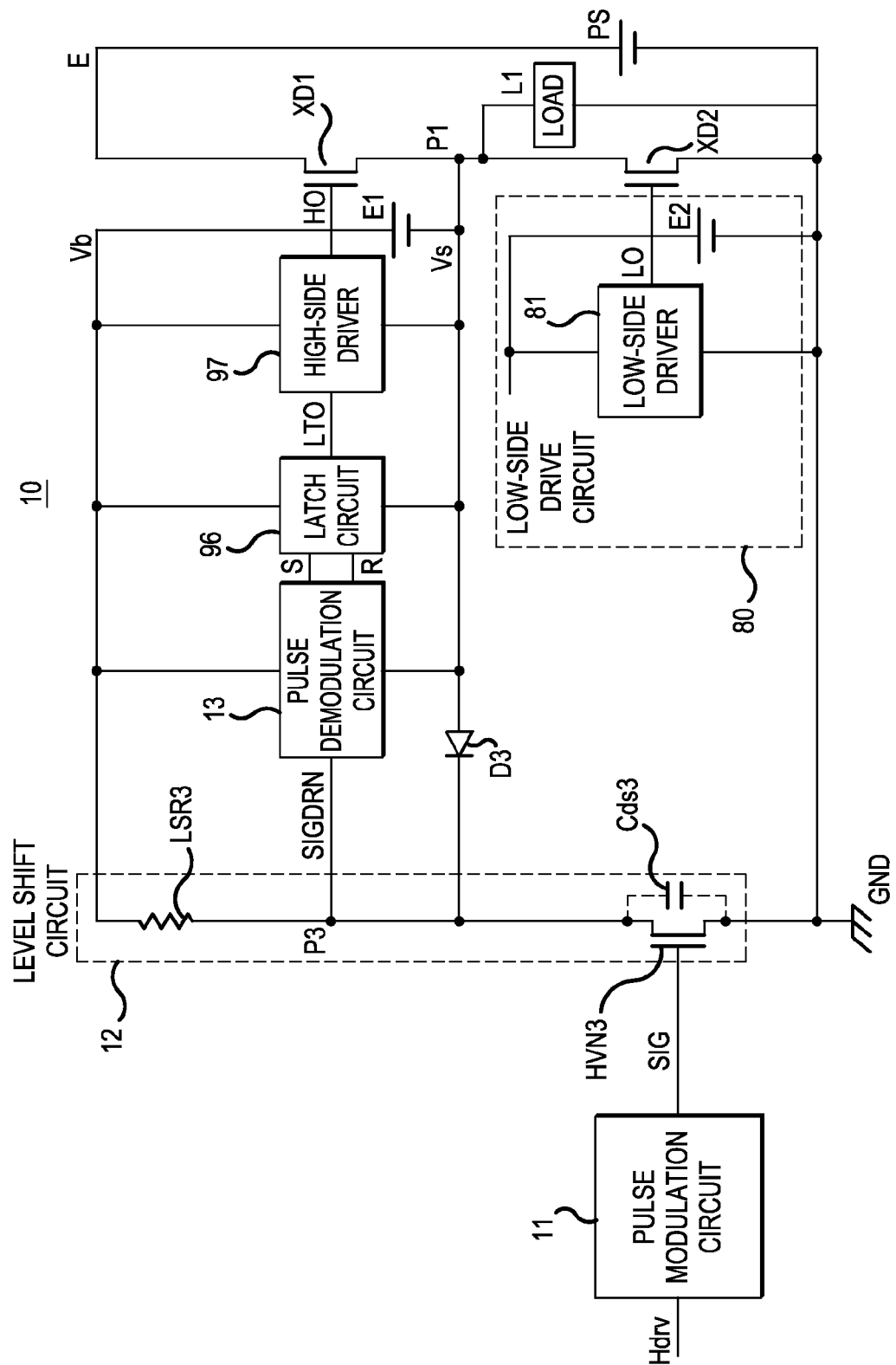
FIG. 1 is a block configuration diagram of a semiconductor device (high-side drive circuit 10) of an embodiment of the present invention.
Figure 16:
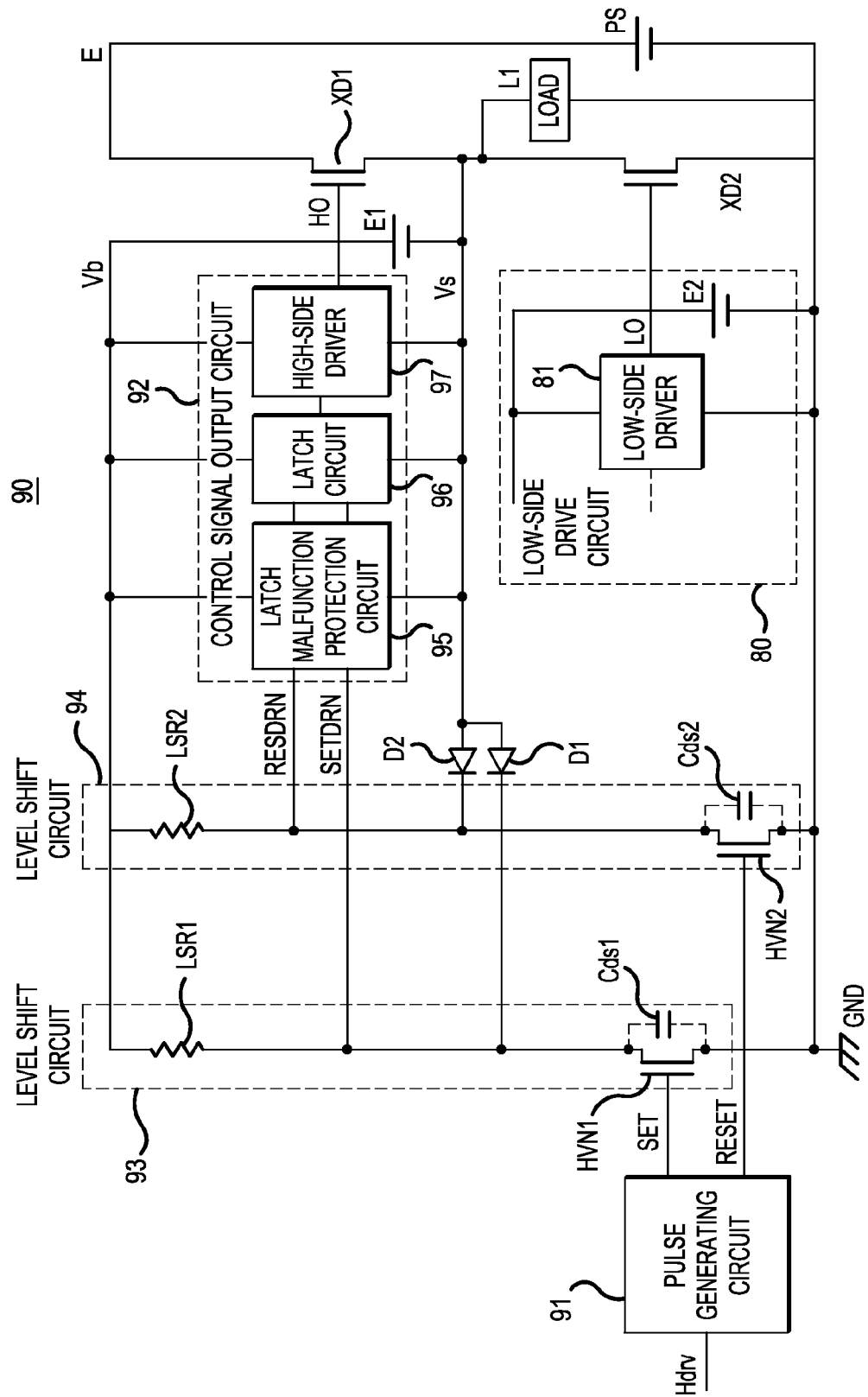
FIG. 16 is a block configuration diagram of the high-side drive circuit 90 shown in FIG. 15.
Figure 17:
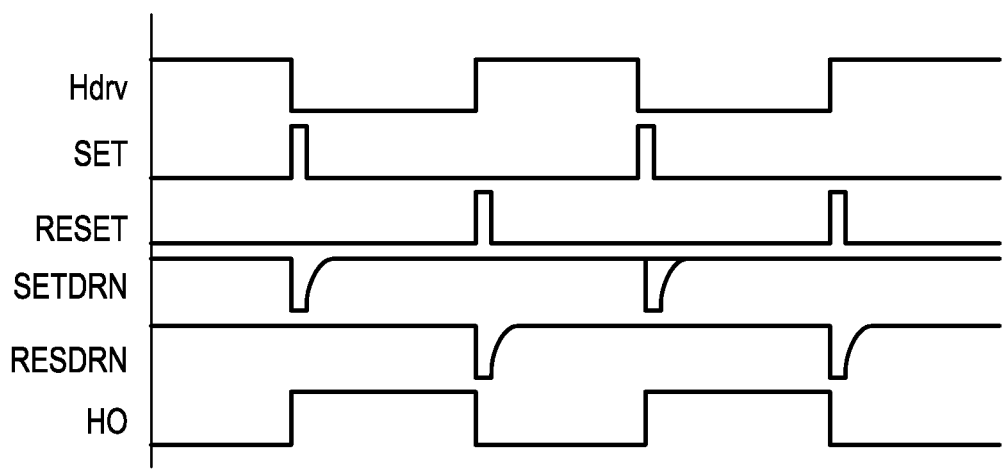
FIG. 17 is an operation time chart of the conventional high-side drive circuit 90 shown in FIG. 16.

FIG. 1 is a block diagram of a high-side drive circuit 10 as an example of the semiconductor device according to an embodiment of the present invention. The elements same as those in FIG. 16 are assigned with same reference numerals and the explanation thereof is herein omitted.

In FIG. 1, the high-side drive circuit 10 includes a pulse modulation circuit 11 that generates a predetermined pulse modulation signal (SIG) from one output terminal at an ON/OFF timing of an input signal (Hdrv) of a low-potential system; one level shift circuit 12 that shifts the pulse signal to a high-potential system; a pulse demodulation circuit 13 that demodulates the shifted pulse signal (SIGDRN) and generates a set signal and a reset signal; a latch circuit 96 that holds the set signal and reset signal; and a high-side driver 97 that outputs a drive signal (H0) of a high-potential-side switching element on the basis of the output of the latch circuit 96.

The output signal H0 from the high-side driver 97 is inputted to a gate terminal of a high-potential-side switching element XD1 and the high-potential-side switching element XD1 is switched ON/OFF.

Meanwhile, a low-potential-side switching element XD2 is switched ON/OFF by a low-side driver 81 of the conventional low-side drive circuit 80. The high-potential-side switching element XD1 and the low-potential-side switching element XD2, which are connected in series, are connected to an external power source PS, and a connection point P1 of the two switches is connected to one end of a load L1. The other end of the load L1 is connected to the ground side of the external power source PS.

Further, in FIG. 1, a level shift circuit 12 is constituted by a series circuit of a resistance element LSR3 connected at one end to the drain of an N-channel MOSFET (HVN3). In the level shift circuit 12, the other end of the resistance element LSR3 is connected to a high-potential-side power source potential (Vb) of a secondary-side potential system. The source terminal of the MOSFET (HVN3) is connected to the low-potential-side power source potential (GND) of the primary-side potential system and secondary-side potential system. The modulated signal (SIG) outputted from the pulse modulation circuit 11 is inputted to the gate terminal of the N-channel MOSFET (HVN3), and the shifted pulse signal (SIGDRN) is outputted from a connection point P3 of the resistance element LSR3 and the N-channel MOSFET (HVN3).

As mentioned hereinabove, the high-side drive circuit 10 of the present example features the configuration which uses one level shift circuit 12 constituted by the resistance element and N-channel MOSFET, and in which the pulse modulation circuit 11 is connected to the input terminal (gate terminal of MOSFET) of the level shift circuit 12, and the pulse demodulation circuit 13 is connected to the output terminal (connection point P3) of the level shift circuit 12.

A diode D3 is connected between the connection point P3, which is the output terminal of the level shift circuit 12, and a reference potential (Vs) on the high side, the connection point P3 being on the cathode side of the diode. The diode D3 serves to maintain a constant Vb-Vs potential.

(Configuration of Pulse Modulation Circuit)

Figure 2:
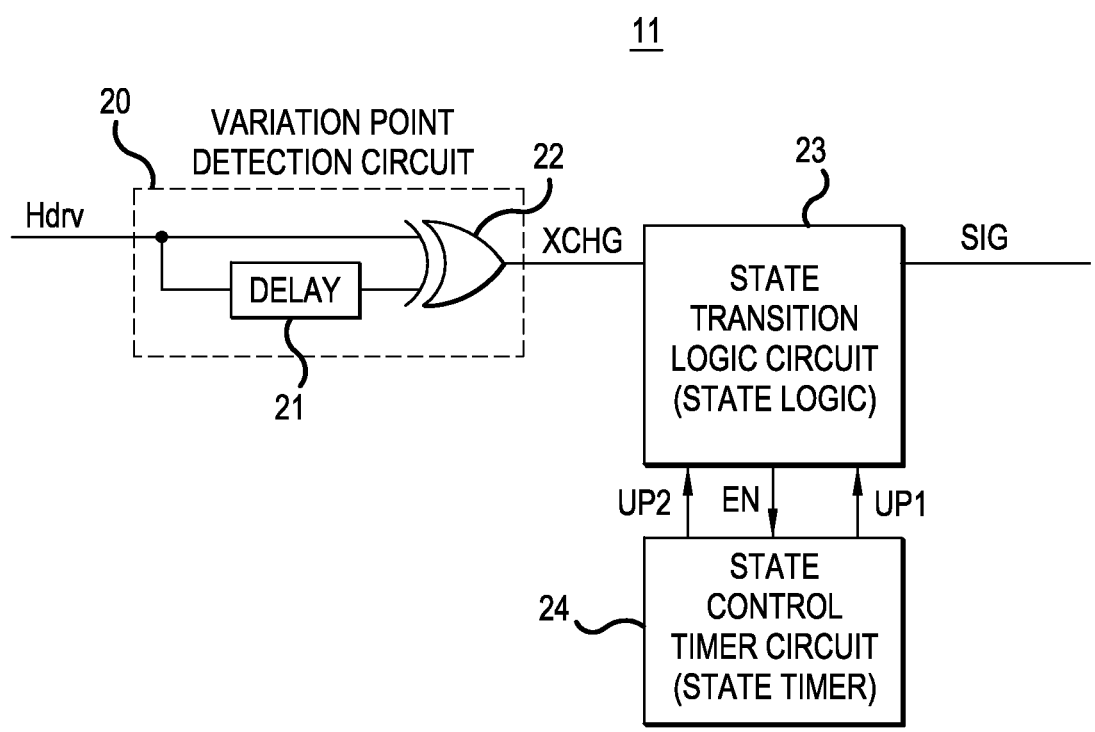
FIG. 2 is a block configuration diagram of the pulse modulation circuit 11 shown in FIG. 1.
Figure 3:
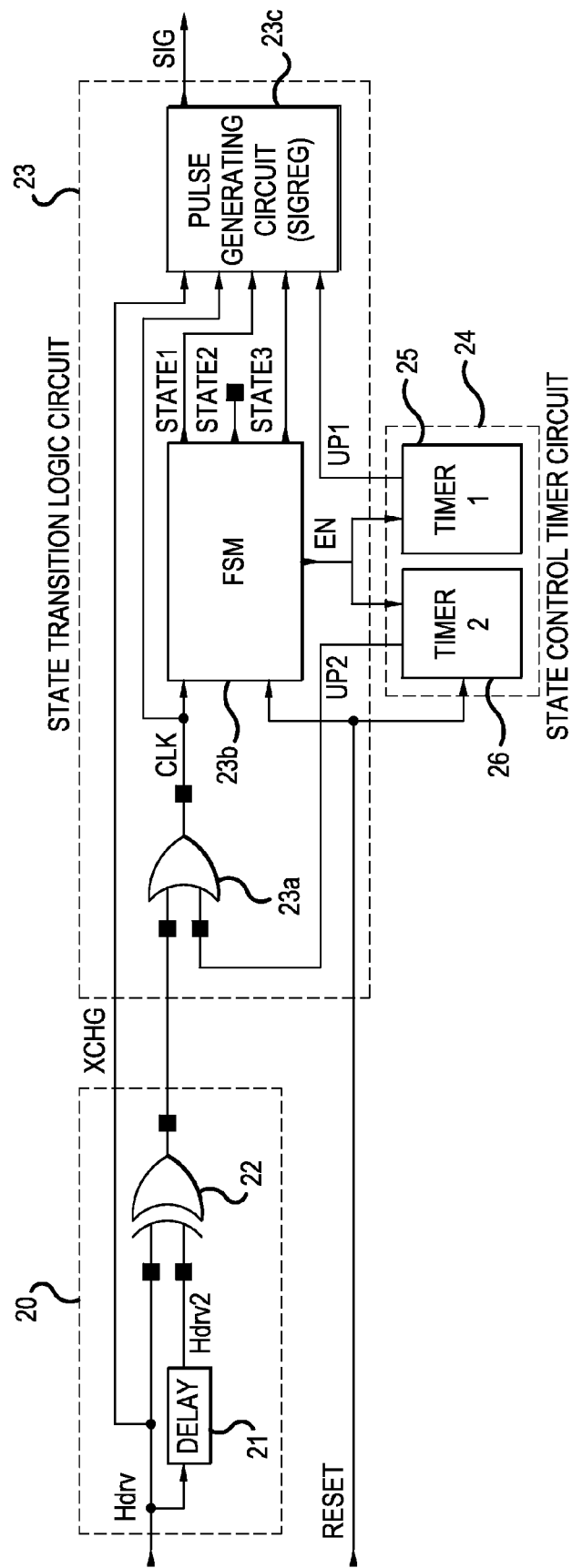
FIG. 3 is a detailed block configuration diagram shown in FIG. 2.

FIG. 2 is a block configuration diagram of the pulse modulation circuit 11. The pulse modulation circuit 11 has the following three main constituent elements: a variation point detection circuit 20 that detects a modulation start timing, a state transition logic circuit 23, and a state control timer circuit 24.

In the variation point detection circuit 20, the control input signal (Hdrv) is connected to one input terminal of a two-input exclusive OR (EX-OR) circuit 22, and the control input signal (Hdrv) is connected to the other input terminal of the exclusive OR circuit 22 through a delay circuit (DELAY) 21. The output terminal of the exclusive OR circuit 22, that is, the output terminal of the variation point detection circuit 20, is connected to the input terminal of the state transition logic circuit 23, and a pulse signal (SIG) is outputted from the state transition logic circuit 23. The state transition logic circuit 23 is operated by the state control timer circuit 24.

The state transition logic circuit 23 has a state machine (FSM) 23b with a state transition initiated by an input clock signal (CLK) as shown in FIG., 3, and a pulse generating circuit (SIGREG) 23c generating a pulse signal according to the internal state of the state machine 23b. The clock signal (CLK) used in the state machine 23b is produced by the logical sum condition of a one-shot pulse signal (XCHG), which is an output signal of the variation point detection circuit 20, and an output signal (UP2) of a second timer circuit 26 determining a state control timing.

(Operation of Pulse Modulation Circuit)

Figure 4:
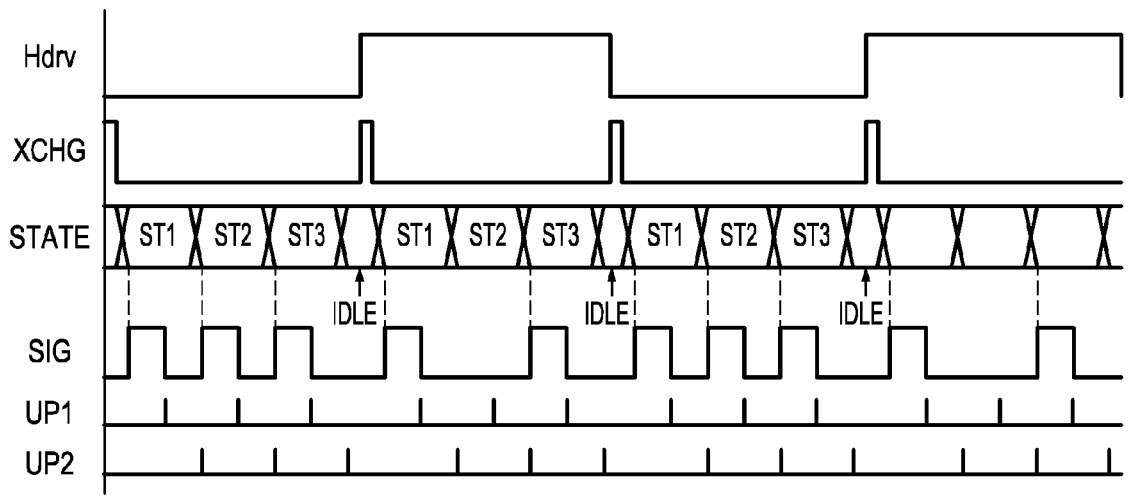
FIG. 4 is an operation time chart of the pulse modulation circuit 11 shown in FIG. 1.

FIG. 4 is an operation time-chart of the pulse modulation circuit 11 having the abovementioned configuration.

The pulse modulation circuit 11 detects the rise edge of the control input signal (Hdrv) with the variation point detection circuit 20 and generates the one-shot pulse signal (XCHG). This pulse signal changes an idle state (IDLE), which is the initial state of the state machine 23b of the state transition logic circuit 23 to the next state (ST1). The pulse modulation circuit 11 has two timer circuits. A first timer circuit 25 determines the fall timing of the output signal (SIG) of the pulse modulation circuit and the second timer circuit 26 determines the state transition timing of the state machine 23b.

In the present example, the state machine 23b has a total four internal states. including the idle state (IDLE). The three states (ST1/ST2/ST3) other than the idle state (IDLE) are data numbers in a modulated data format. The three data are produced in the pulse modulation circuit 11 of the present example.

(State Transition of State Machine)

Figure 5:
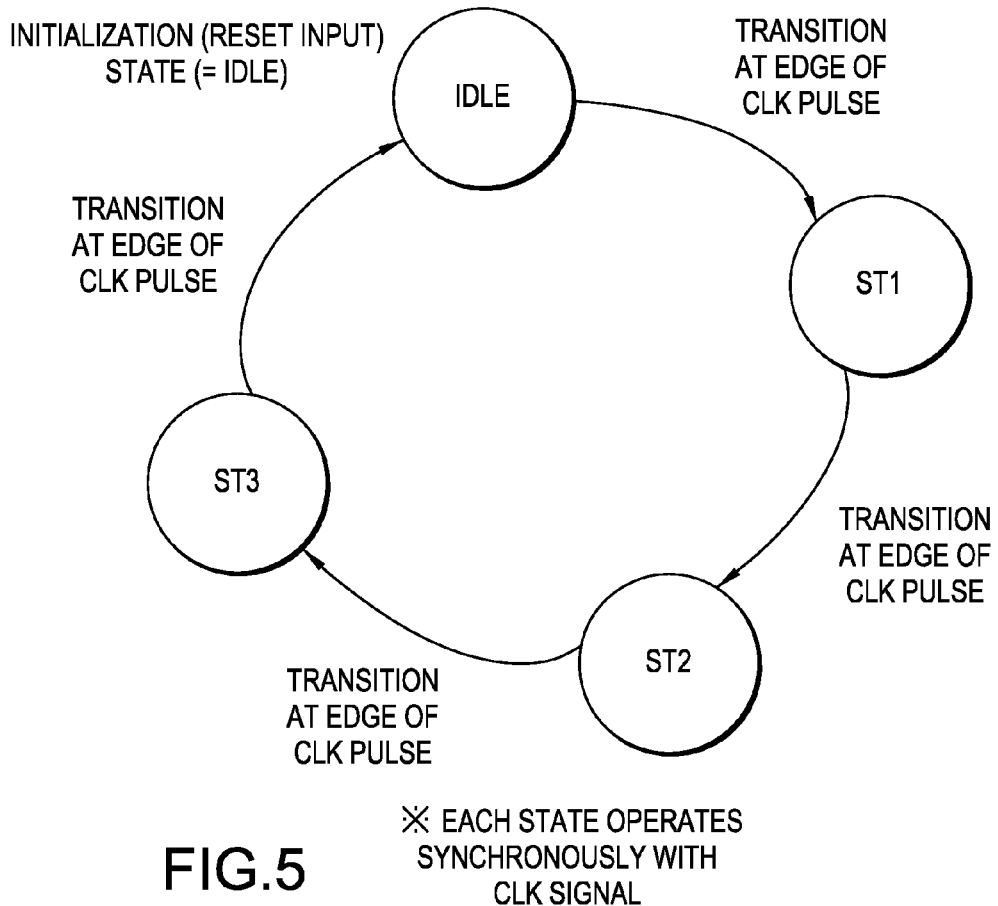
FIG. 5 is a state transition diagram of the state machine (FSM) 23b shown in FIG. 2.

FIG. 5 shows a state transition diagram of the state machine (FSM) 23b. Basically, state transition is implemented in the order of IDLE→ST1→ST2→ST3 IDLE by the rise of the inputted clock signal. For each of the states ST1, ST2, ST3, the output signals STATE1, STATE2, STATE3 are active. An EN (enable) signal, which is a signal for actuating the timer circuits 25, 26, is active between the transition states.

(Configuration of State Control Time Circuit 24)

The timer circuit 24 of the present example uses two timer circuits using an RC time constant. A first timer circuit 25 is used for generating the fall timing of a data symbol, which is a modulated pulse, produced by the pulse modulation circuit 11. A second timer circuit 26 is used for detecting the rise of the control input signal and determining the state transition timing of the state machine 23b.

Figure 6:
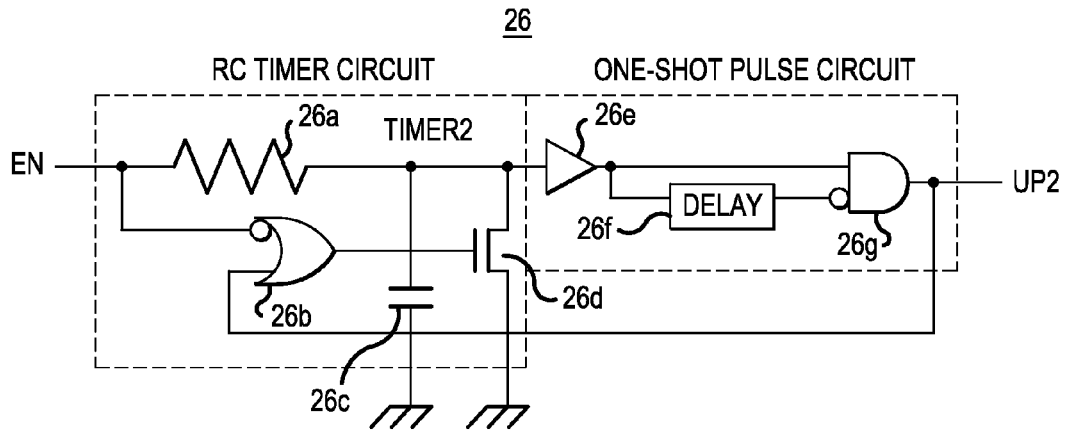
FIG. 6 is a circuit configuration diagram of the second timer circuit 26 shown in FIG. 3.

FIG. 6 shows the circuit configuration of the second timer circuit 26. The time count is performed by an RC circuit constituted by a resistor 26a and a capacitor 26c. The timer circuit 26 starts charging the capacitor 26c, that is, starts the time count, when the EN signal, which is the output of the state machine 23b, changes from an L level to a H level. Where a predetermined time interval elapses and the input voltage of a buffer 26e exceeds a threshold, the output of the buffer 26e changes from the L level to the H level. As a result, a one-shot pulse signal is outputted from an AND circuit 26g. Accordingly, an N-channel MOSFET 26d is switched ON via an OR circuit 26b, and the electric charge that has been charged into the capacitor 26c is discharged. Where the EN signal is at the H level after the discharge, the second timer circuit 26 repeats the recount and also the discharge in a specified time interval. In a control period of time of the second timer circuit 26, that is, as long as the EN signal is at the H level, the timer circuit performs the count and a transition is made between the states of the state machine 23b.

The value of the RC time constant is set with consideration for the time interval in which a signal is reliably transmitted from the low side to the high side. Further, the value of "RC time constant"×"number of state transitions"+α is set to be equal to or lower than the minimum pulse width (tPW) of the control input signal Hdrv. Here, a is a time margin necessary for other control. The ON period of the EN signal is predetermined according to the type of the pulse to be generated.

Figure 7:
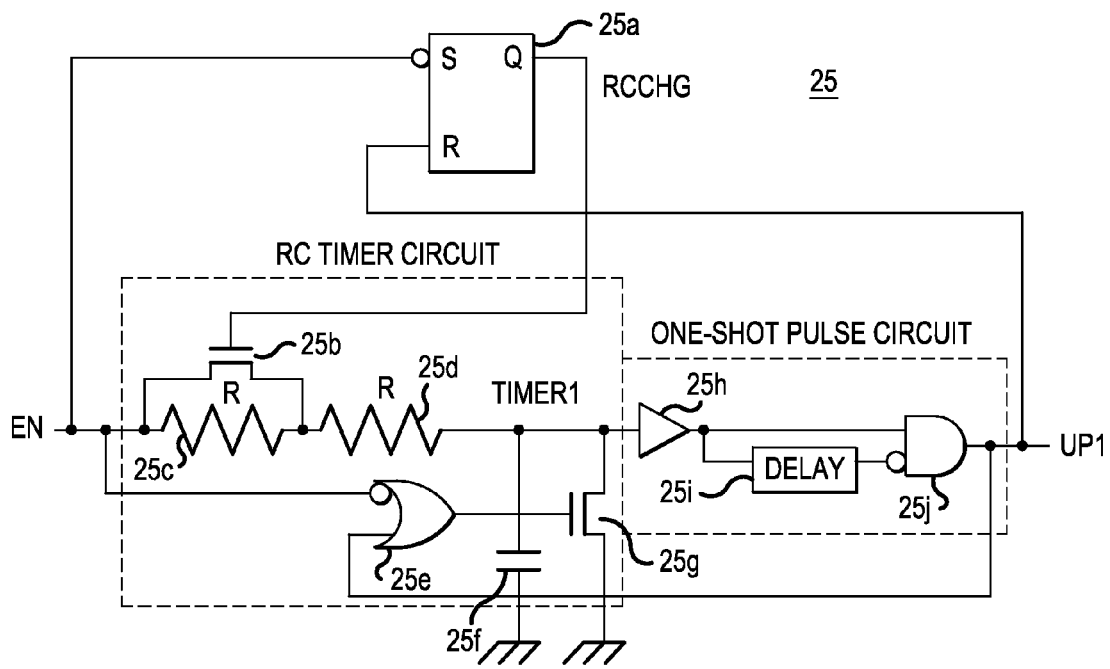
FIG. 7 is a circuit configuration diagram of the first timer circuit 25 shown in FIG. 3.

FIG. 7 shows a circuit configuration of the first timer circuit 25. The time count is performed by an RC circuit constituted by resistors 25c, 25d and a capacitor 25f. Where the threshold of the buffer 25h is reached, a one-shot pulse signal is generated, and the timer is reset. The first timer circuit 25 performs the control different from that of the second timer circuit 26 in order to determine the fall timing of the output (SIG) of the pulse modulation circuit 11. The second timer circuit 26 performs the count in the same period according to the EN signal. However, the first timer circuit 25 is controlled such that only in the initial count, the RC time constant becomes half of the subsequent period. For this purpose, the latch circuit 25a for control is provided in the first timer circuit 25.

The resistors 25c, 25d of the RC time constant circuit of the first timer circuit 25 each have a resistance value which is half that of the resistor 26a of the second timer circuit 26. Further, the electrostatic capacitance of the capacitor 25f of the RC time constant circuit of the first timer circuit 25 is equal to the electrostatic capacitance of the capacitor 26c of the second timer circuit 26.

When the input signal (EN) of the first timer circuit 25 is at the L level, the latch circuit 25a is set, and the output RCCHG of the latch circuit 25a is at the H level. This latch output acts such that the resistance element 25c, which is one of the two resistance elements connected in series in the RC time constant circuit, is short circuited by the MOSFET 25b. Therefore, the resistance value of the RC time constant circuit is only the resistance value of the resistor 25d. Thus, the resistance value of the RC time constant circuit is half the total resistance value of the two resistors connected in series. Once the timer indicates time up, the output of the latch circuit 25a is reset and the latch output RCCHG is at the L level. Accordingly, the MOSFET 25b connected to the resistance element 25c is in the OFF state. Therefore, the resistance value of the RC time constant circuit assumes a value which is twice that assumed when the output RCCHG is at the H level. As a result, subsequent RC time constant operates in the same state as the RC time constant of the second timer circuit 26. Therefore, the spacing of the timer count interval is the same.

Figure 8:
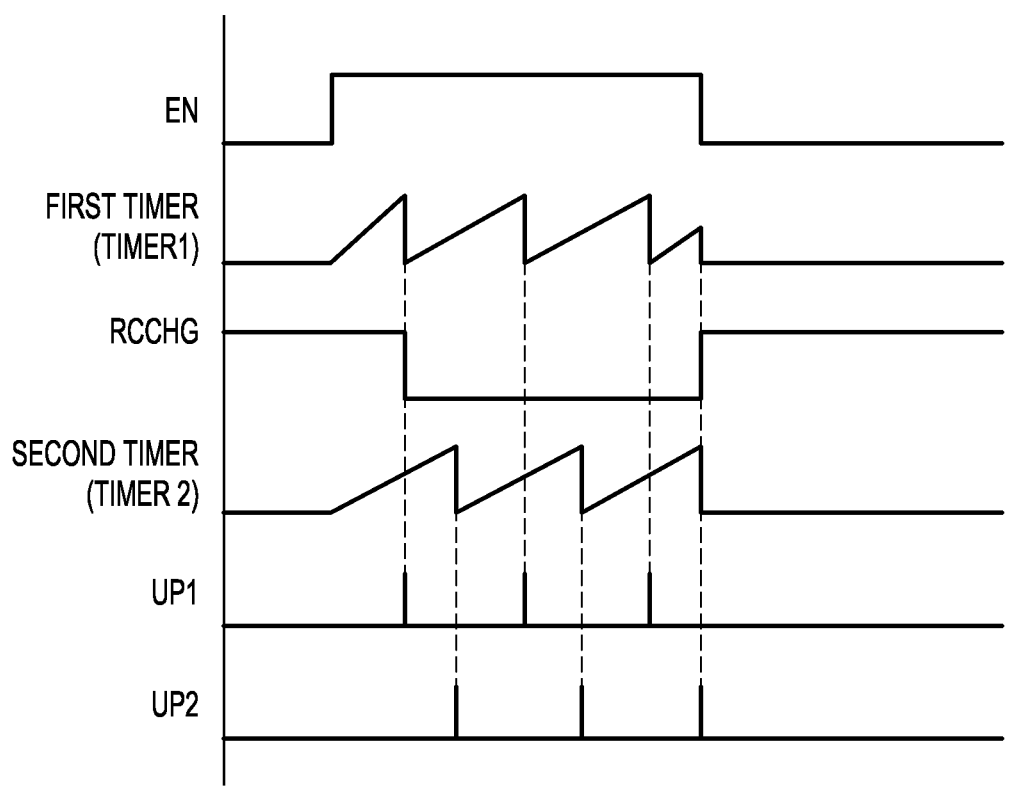
FIG. 8 shows time charts of the timer circuits 25, 26 shown in FIGS. 6 and 7.

FIG. 8 shows the timer chart of the timer circuits 25, 26 of the present example. In the present example, the charge voltage waveform (TIMER2) of the capacitor 26c of the second timer circuit 26 is a sawtooth waveform with three teeth matching the number of states in order to count the transition time interval of the state machine. In the output signal (UP1) of the first timer circuit 25, a pulse is generated at a timing which is half a period before that in the output signal (UP2) of the second timer circuit 26.

(Timing Chart of Pulse Modulation Circuit 11)

Figure 9:
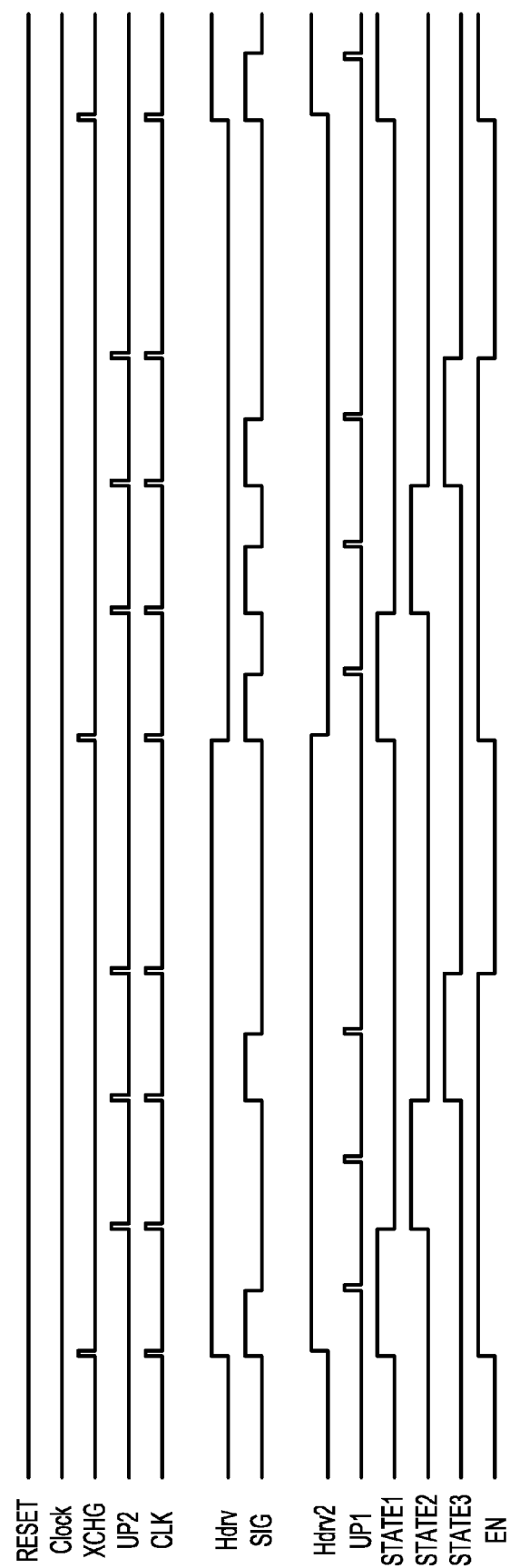
FIG. 9 shows a result of circuit simulation for the pulse modulation circuit shown in FIG. 2.

FIG. 9 shows a circuit simulation result for the pulse modulation circuit. Where the control input signal Hdrv changes from the L level to the H level or from the H level to the L level, the output signal SIG of the pulse modulation circuit 11 makes a transition between three states (ST1, ST2, ST3) in the order of description, and pulse data are outputted for each of the states. The format of the output signal SIG of the present example is as follows: ST1: start bit, ST2: data bit, and ST3: end bit. The data bit indicating the set signal (SET) is configured without a pulse, and the data bit indicating the reset signal (RESET) is configured with a pulse. Therefore, when the control input signal Hdrv assumes the H level, the output signal SIG has a data format with the following configuration: with a pulse→without a pulse→with a pulse. When the control input signal Hdrv assumes the L level, the output signal SIG has a data format with the following configuration: with a pulse→with a pulse→with a pulse.

(Block Configuration of Pulse Demodulation Circuit)

Figure 10:
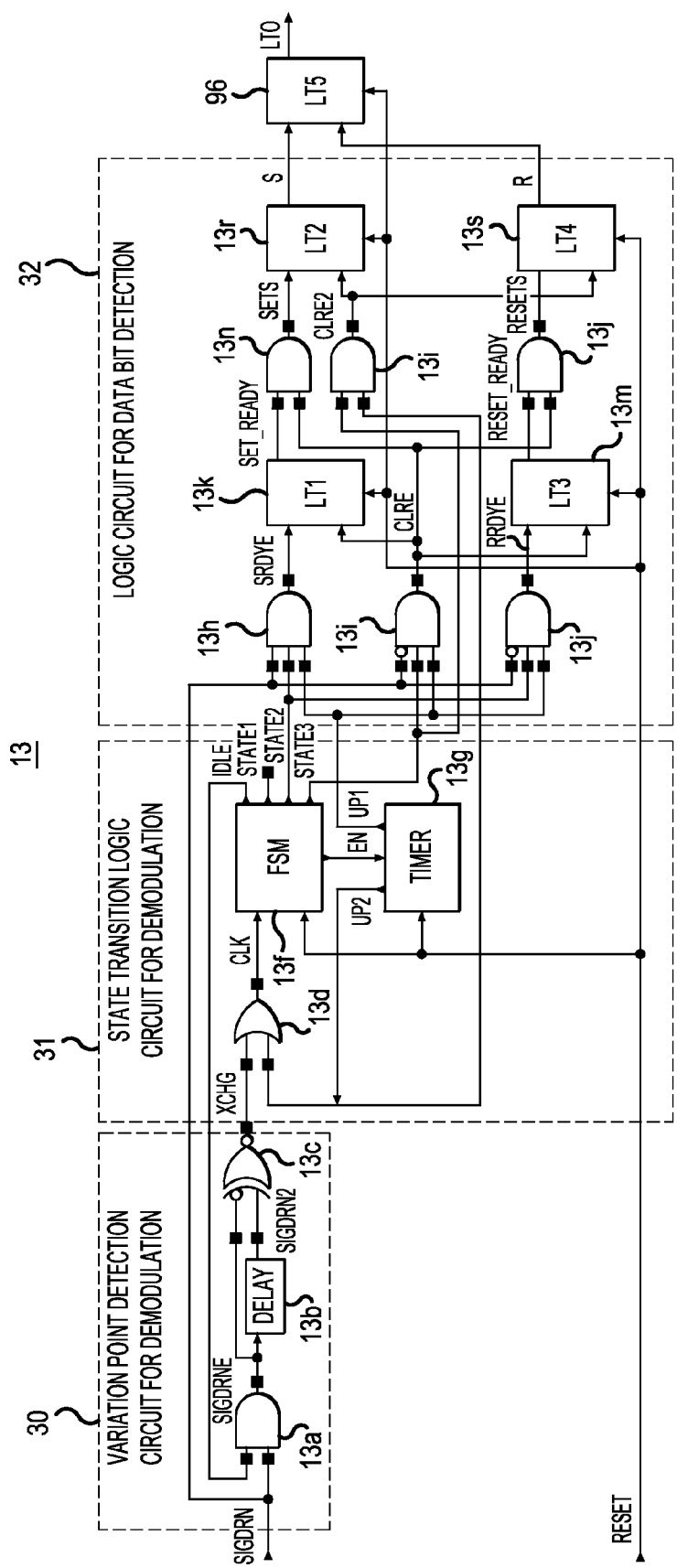
FIG. 10 is a block configuration diagram of the pulse demodulation circuit 13 shown in FIG. 1.

FIG. 10 shows the block configuration of the pulse demodulation circuit 13. A variation point detection circuit 30 for demodulation and a state transition logic circuit 31 for demodulation correspond to the variation point detection circuit 20 and the state transition logic circuit 23, respectively, of the pulse modulation circuit 11. A state machine (FSM) 13f and a state control timer circuit (TIMER) 13g of the state transition logic circuit 31 for demodulation have the same functions as those of the state machine (FSM) 23b and the state control timer circuit 24, respectively, of the state transition logic circuit 23.

A logic circuit 32 for data bit detection is additionally used in the pulse demodulation circuit 13. The variation point detection circuit 30 for demodulation detects the variation point of the shifted output signal (SIGDRN), which is a negative logical signal, and outputs one-shot pulse signal ( )CHG) only in the idle state (IDLE).

In the logic circuit 32 for data bit detection, a latch circuit 13k is set by the timer output signal (UP1) when the shifted output signal (SIGDRN) is positive in the state ST2. A latch circuit 13r is ON at the output timing of the next timer output signal (UP1) which has set ON the latch circuit 13k. Then, the latch circuit 13r is OFF at the output timing of the timer output signal (UP2). As a result, a one-shot set signal (S) is outputted from the latch circuit 13r.

Further, a latch circuit 13m is set by the timer output signal (UP1) when the shifted output signal (SIGDRN) is negative in the state ST2. A latch circuit 13s is ON at the output timing of the next timer output signal (UP1) which has set ON the latch circuit 13m. Then, the latch circuit 13s is OFF at the output timing of the timer output signal (UP2). As a result, a one-shot reset signal (R) is outputted from the latch circuit 13s.

(Operation of Pulse Demodulation Circuit)

Figure 11:
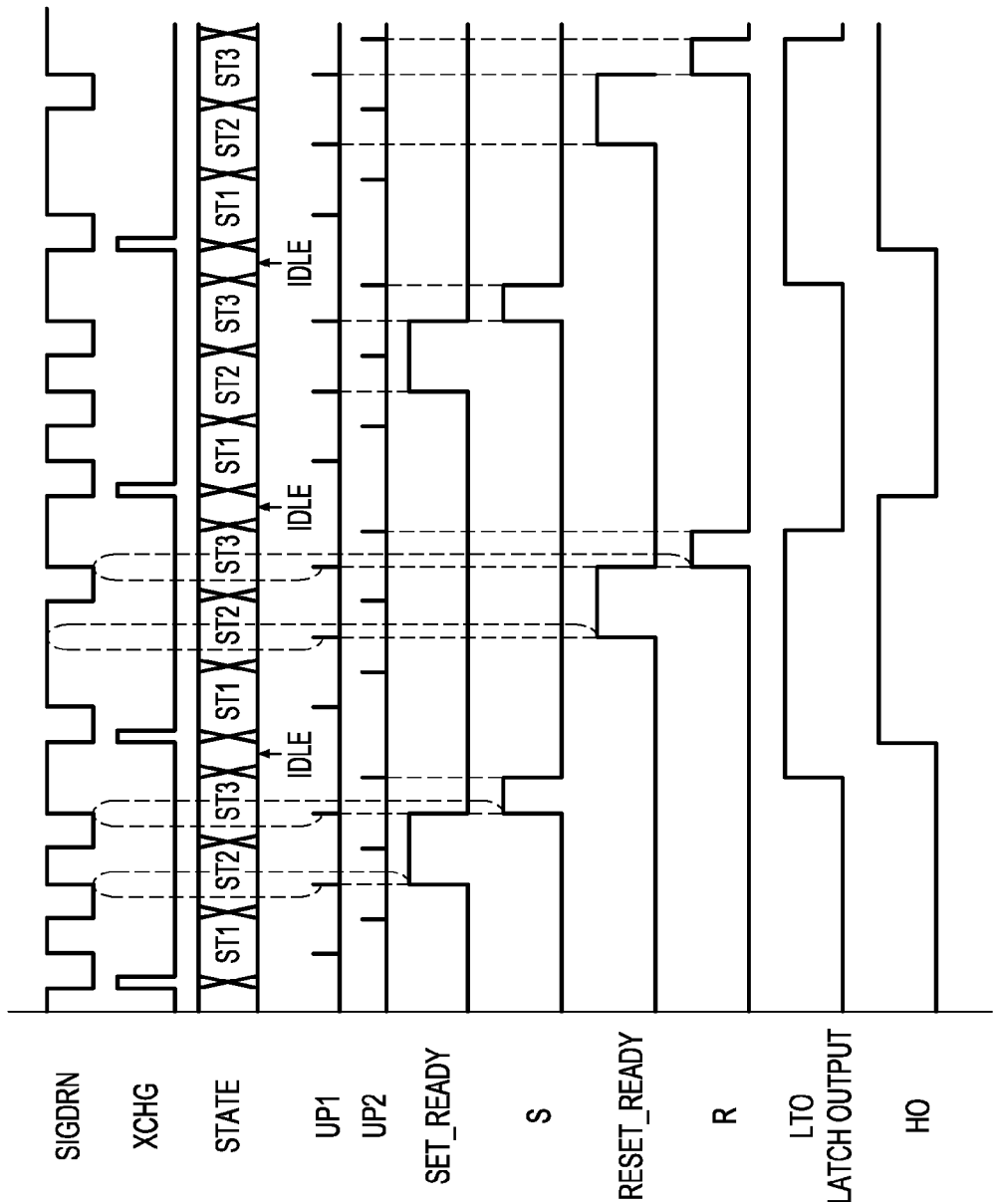
FIG. 11 is an operation time chart of the pulse demodulation circuit 13 shown in FIG. 10.

FIG. 11 shows an operation time chart of the pulse demodulation circuit 13. The shifted output signal (SIGDRN) outputted from the level shift circuit 12 is an input signal to the pulse demodulation circuit 13. The shifted output signal (SIGDRN) is logically inverted with respect to the output signal (SIG) of the pulse modulation circuit 11.

The pulse demodulation circuit 13 outputs the one-shot pulse signal (XCHG) identifying the start of demodulation by detecting the fall of the shifted output signal (SIGDRN) in the initial state (IDLE state).

The state machine (FSM) 13f and the state control timer circuit 13g of the pulse demodulation circuit 13 have the same functions as those of the state machine (FSM) 23b and the state control timer circuit 24 of the pulse modulation circuit 11. The time constants of the state control timer circuits 13g, 24 are also the same.

Therefore, the EN signal of the state machine (FSM) 13f is set ON for a fixed time by the generation of the one-shot pulse signal (XCHG). The two timer circuits (first timer circuit and second timer circuit) of the state control timer circuit 13g then operate as long as the EN signal is ON. As a result, output signals (UP1, UP2) of the state control timer circuit 13g are outputted with a time spacing same as during the modulation from the generation timing of the one-shot pulse signal (XCHG).

In this case, the output signal (UP2) of the state control timer circuit 13g is a pulse signal for causing a state transition in the state machine (FSM) 13f. The output signal (UP1) of the state control timer circuit 13g is a pulse signal for latching the data bit (SIGDRN) in the ST2 state.

The set signal (S) and the reset signal (R), which are the output signals of the pulse demodulation circuit 13, are generated by taking in the data bits (SET_READY, RESET_READY) latched by the timer output signal (UP1) with the next timer output signal (UP1). A latch output (LT0) is obtained by latching the pulse signals of the set signal (S) and reset signal (R) with the latch circuit 96.

The above-described processing ends the demodulation process. The LT0 signal is an H0 output inputted to the gate of the high-potential-side switching element) XD1 through the high-side drive 97.

Figure 12:
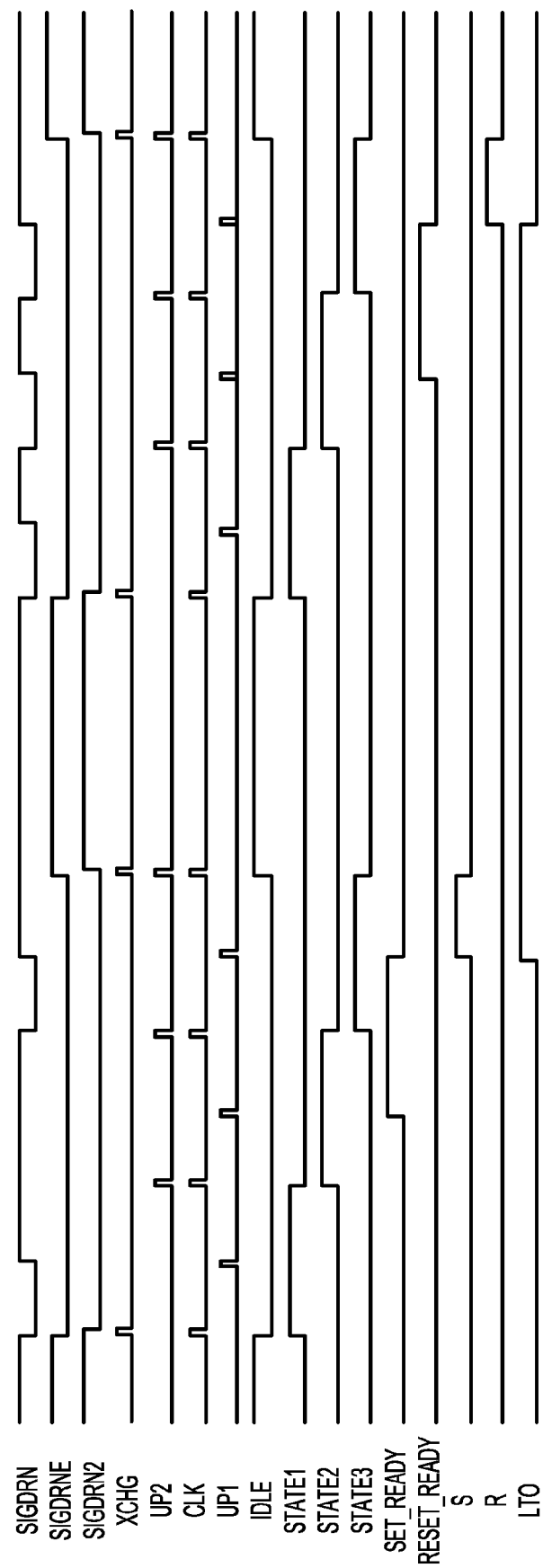
FIG. 12 shows a result of circuit simulation for the pulse demodulation circuit 13 shown in FIG. 10.

FIG. 12 shows a circuit simulation result relating to the pulse demodulation circuit 13. The LT0 signal is demodulated on the basis of three pulses of the SIGDRN signal.

As explained hereinabove, the specific feature of the high-side drive circuit of the embodiment of the present invention is that only one level shift circuit is used, a pulse modulation circuit is provided instead of a low-potential-side pulse generating circuit, and a demodulation function is added to the front stage of the high-potential-side latch circuit.

Figure 13A:
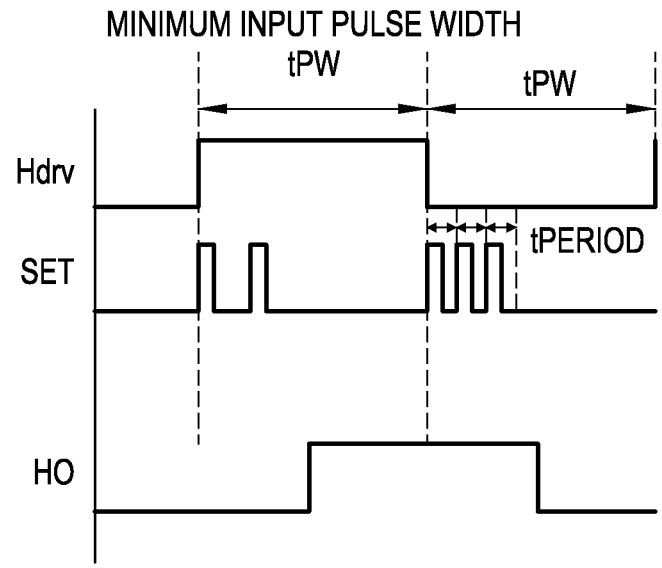
FIGS. 13A and 13B show time charts (FIG. 13A) of the input-output signals (Hdrv, H0) of the high-side drive circuit 10 shown in FIG. 1 and the modulated signal (SIG), and a time chart (FIG. 13B) of the conventional high-side drive circuit 90.
Figure 13B:
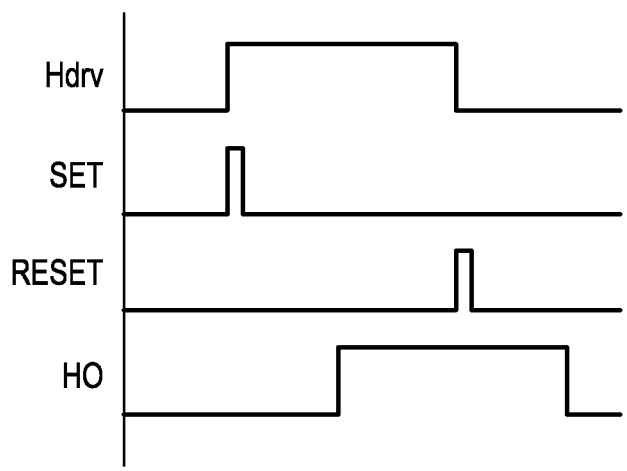

The time charts of the input signals (Hdrv, H0) of the high-side drive circuit 10 configured as shown in FIG. 1 and the modulated signal (SIG) are shown in FIG. 13A. For the sake of comparison, FIG. 13B also shows the time chart of the conventional system.

As shown in FIG. 13A, the specific feature of the present invention is that the minimum pulse width (tPW) of the control input signal Hdrv is determined, and the transmission of at least two or more pulse signals is performed from the low side to the high side within the time interval of the minimum pulse width (tPW).

Figure 14A:
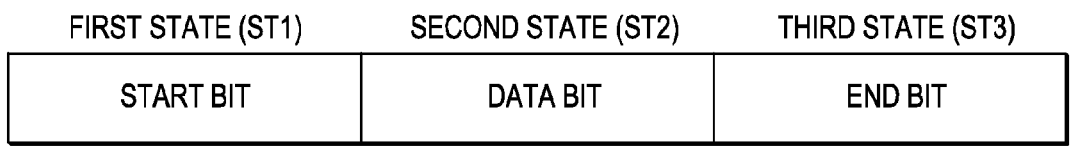
FIGS. 14A and 14B show a data format for the case in which the number of pulses is three according to the embodiment of the present invention (FIG. 14A) and a data format for the case with a minimum number of pulses (two) (FIG. 14B)
Figure 14B:
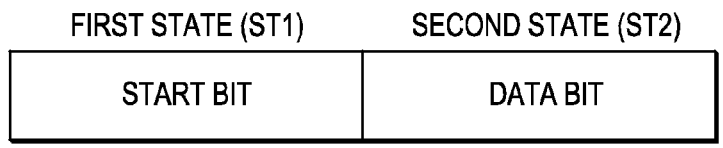
Figure 15:
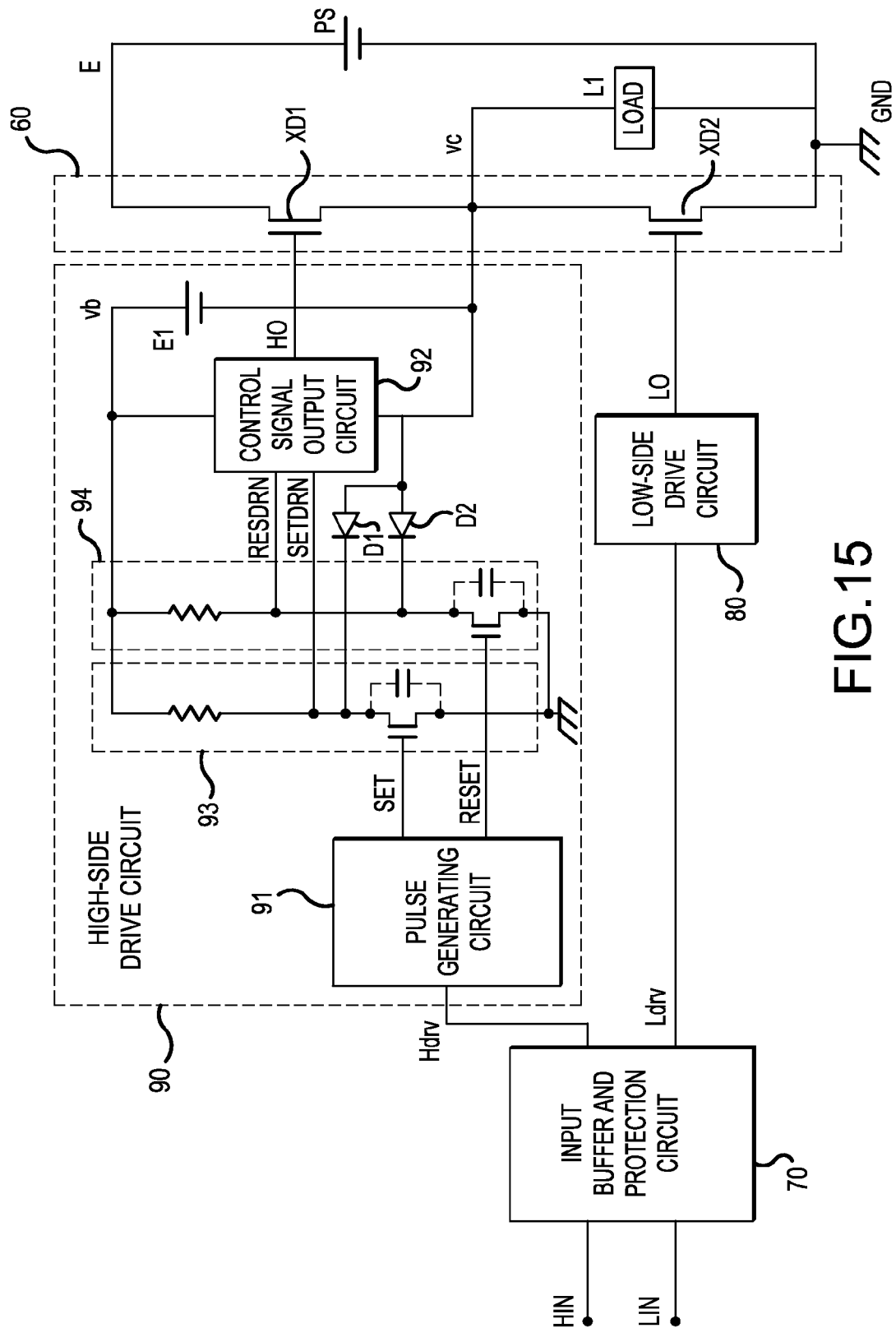
FIG. 15 is a block configuration diagram of the conventional half-bridge circuit.

The data format of a pulse signal with the number of pulses (three) according to the present example and the data format of a pulse signal with a minimum number of pulses (two) are shown in FIGS. 14A and 14B, respectively. The very first pulse signal of the data generated at the modulation side indicates the start bit and ensures the output of a pulse signal. The start of the data signal is recognized at the demodulation side by this pulse signal. The second data represent a data bit. Whether or not a pulse is present is determined by the value of binary data. The binary data are used to represent a set signal and a reset signal. For example, the set state represents a state with a pulse, and the reset state represents a state without a pulse. Thus, in the present invention, modulation and demodulation can be performed by at least two pulses, the data format used for modulation and demodulation is only 1: start bit, 2: data bit, and modulation and demodulation can be performed by using three states of state transition logic (FSM), including the IDLE state.

Meanwhile, the minimum value of the number of pulses that can be used by the present invention is two. Further, the precondition of the present invention is that the minimum pulse width (tPW) of the control input signal Hdrv is determined in advance and the transmission of at least two pulse signals is performed from the low side to the high side within the time interval of the minimum pulse width (tPW). The high-side drive circuit, which is the semiconductor device in accordance with the present invention, can perform modulation and demodulation of data by using a plurality of pulses, provided that the precondition is fulfilled. In this case, a simple parity bit can be added for identifying a false pulse, or an error correction code for correcting the false pulse can be added. By increasing the data bit length, it is possible to perform error correction and transmit information other than the set signal or reset signal. For example, a delay assurance function relating to temperature fluctuations by which the RC time constants shown in FIGS. 6 and 7 can be finely adjusted on the basis of temperature information can be also provided.

According to the above-described embodiment of the present invention, the high-potential side switching element can be driven by a single level shift circuit. Therefore, the cost can be reduced. Further, in the above-described embodiment of the present invention, the set signal and reset signal for controlling the high-potential-side switching element are transmitted by modulation and demodulation in the single level shift circuit. Therefore, the effect of dV/dt noise or the like can be reduced and malfunction caused by the spread in characteristics of devices when the system is configured by two level shift circuits can be prevented.

In the present example, a level-up circuit group is explained in which signal transmission in the level-up direction is performed from the low side to the high side. A level-down circuit group in which signal transmission in the level-down direction is performed from the high side to the low side can be also realized by exchanging the modulation-demodulation circuits at the high side and low side.

The semiconductor device in accordance with the present invention can also perform bidirectional signal transmission when the level-up circuit group and level-down circuit group are provided. For example, the level-down circuit group can be used for overcurrent detection in the high-potential-side switching element XD1 driven by the output (H0) of the high side, and for transmitting the overcurrent detection result to the low side.

The invention claimed is:

1. A semiconductor device that performs, from among a high-potential-side switching element and a low-potential-side switching element, which are connected in series and which are interposed between a high-potential main power supply potential and a low-potential main power supply potential, drive control of the high-potential-side switching element, the semiconductor device comprising:
   only one level shift circuit that receives a single line input signal of a low-side region operating in a low-voltage potential system, and outputs a single line output as a signal of a high-side region operating in a high-voltage potential system, upon raising a signal level;
   a pulse modulation circuit that operates in a low-side region, generates a data symbol constituted by 2 or more bits and representing a set signal or a reset signal, and outputs the generated data symbol as the single line input signal of the level shift circuit;
   a pulse demodulation circuit that operates in a high-side region, demodulates the data symbol outputted from the level shift circuit, and generates a level-shifted set signal or reset signal; and
   a control circuit that controls conduction/non-conduction of the high-potential-side switching element on the basis of the level-shifted set signal or reset signal outputted from the pulse demodulation circuit.

2. The semiconductor device according to claim 1, wherein the pulse modulation circuit has:
a state machine in which an internal state makes a successive transition in response to a clock input;
a first timer circuit that determines a fall timing of the data symbol; and
a second timer circuit that detects a rise of a control input signal and determines a state transition timing of the state machine, and
the state machine makes a successive transition at least to a first state and a second state as determined by the second timer circuit, sends a start bit when in the first state, and sends a data bit representing a set signal or a reset signal when in the second state.

3. The semiconductor device according to claim 1, further comprising:
a level shift circuit group which is provided with the level shift circuit that outputs an input signal of a high-side region as a signal of a low-side region upon lowering a signal level, and which can implement bidirectional signal transmission.

4. The semiconductor device according to claim 2, further comprising:
a level shift circuit group which is provided with the level shift circuit that outputs an input signal of a high-side region as a signal of a low-side region upon lowering a signal level, and which can implement bidirectional signal transmission.

* * * * *